United States Patent
Gonzalez

(10) Patent No.: US 12,188,993 B2
(45) Date of Patent: Jan. 7, 2025

(54) METHODS FOR DETECTING AN ELECTRICAL FAULT, ASSOCIATED ELECTRICAL PROTECTION SYSTEMS

(71) Applicant: Schneider Electric Industries SAS, Rueil Malmaison (FR)

(72) Inventor: Daniel Gonzalez, Domene (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 121 days.

(21) Appl. No.: 18/075,546

(22) Filed: Dec. 6, 2022

(65) Prior Publication Data

US 2023/0184849 A1 Jun. 15, 2023

(30) Foreign Application Priority Data

Dec. 14, 2021 (FR) ...................................... 2113499

(51) Int. Cl.
*G01R 31/52* (2020.01)
*G01R 31/56* (2020.01)
*H02H 3/32* (2006.01)

(52) U.S. Cl.
CPC ............. *G01R 31/52* (2020.01); *G01R 31/56* (2020.01); *H02H 3/32* (2013.01)

(58) Field of Classification Search
CPC .......... G01R 31/52; G01R 31/56; H02H 3/32; H02H 1/0007; H02H 3/093; H02H 3/08; H02H 7/22
See application file for complete search history.

(56) References Cited

U.S. PATENT DOCUMENTS

| | | | |
|---|---|---|---|
| 2007/0008664 A1* | 1/2007 | Zeuch | H02H 3/025 361/18 |
| 2015/0070026 A1 | 3/2015 | Vincent et al. | |
| 2018/0372800 A1* | 12/2018 | Blanchard | G01R 31/327 |
| 2020/0014187 A1* | 1/2020 | Jakupi | H02H 1/0015 |
| 2020/0105490 A1 | 4/2020 | Hennequin et al. | |
| 2020/0355745 A1 | 11/2020 | Bogus et al. | |

OTHER PUBLICATIONS

French Search Report and Written Opinion dated Jul. 25, 2022 for corresponding French Patent Application No. FR 2113499, 6 pages.

* cited by examiner

*Primary Examiner* — Alvaro E Fortich
(74) *Attorney, Agent, or Firm* — Locke Lord LLP

(57) ABSTRACT

A method for detecting an electrical fault in an electrical installation includes: measuring an alternating electric current flowing through the electrical installation; detecting an electrical fault on the basis of the measured electric current; and tripping the electrical protection device when an electrical fault is identified by the electronic control device. The detection of the fault includes identifying a transition of the measured current from a first level to a second level with a duration lower than a predefined threshold which is lower than or equal to 10% of the nominal period of the alternating electric current, the first level and the second level corresponding to current values of opposite sign but the amplitude of which, in terms of absolute value, is higher than a predefined current threshold equal to the product of the trip threshold of the protection device and a weighting coefficient.

10 Claims, 6 Drawing Sheets

METHODS FOR DETECTING AN ELECTRICAL FAULT, ASSOCIATED ELECTRICAL PROTECTION SYSTEMS

TECHNICAL FIELD

The present invention relates to methods for detecting an electrical fault, and to electrical protection systems for implementing such methods.

The invention more generally relates to the field of electrical protection in installations the distributing electricity.

BACKGROUND

For a long time it has been known to use electrical protection devices, such as circuit breakers, that allow the supply of electricity to an electrical load or to an electrical installation to be interrupted in the case of appearance of an electrical fault, such as a short-circuit. These protection devices thus allow, depending on selectivity rules defined on the scale of the electrical installation, the portion of the electrical installation that is the origin of the electrical fault to be isolated in order to allow the rest of the electrical installation to operate normally.

Such devices generally comprise a tripping device, the function of which is to detect an electrical fault, using electromechanical and/or electronic detection means, to detect when the amplitude of the electric current becomes too high.

For a long time such tripping devices have been satisfactory. However, recent technological advances, such as those related to the development of renewable energies, involving the use of power converters, require protection devices meeting new requirements to be developed.

Specifically, it is increasingly frequent for local or domestic electrical installations to be supplied with power by photovoltaic power sources and/or by devices for storing electricity that are capable of operating as generators from time to time.

Such power sources are generally based on switched-mode power converters, operation of which is based on power semiconductor components. However, because of the presence of these power converters, these power sources have a different behaviour from that of conventional generators in case of electrical fault.

In particular, the fault currents, and especially short-circuit currents, are much lower in amplitude than in conventional installations, because of technical features inherent to the semiconductor components used.

In conventional installations powered solely by the mains grid, the short-circuit currents conventionally encountered may have high amplitudes, sometimes reaching up to several kilo-amperes (kA), because their amplitude is limited only by the impedance of the upstream transformer and/or by the impedance of the distribution cables. In contrast, in installations comprising one or more switched-mode converters, the amplitudes of fault currents are lower, and for example ten times lower or worse.

Thus, in modern installations comprising one or more switched-mode power converters, it is more difficult to detect electrical faults.

To mitigate this problem, in such installations, it is common to decrease the threshold current required to trip the protection devices.

It is for example common to choose a trip threshold five times lower than the maximum current that the power converter of the power source is able to deliver, in order to leave a sufficient margin of safety to be certain that the protection devices will be able to correctly detect a short-circuit.

However, in this case, the electrical loads can then use only a fraction of the electrical power that the power source is theoretically able to deliver.

It is these drawbacks that the invention is more particularly intended to remedy by providing improved methods for detecting an electrical fault in an electrical installation comprising a switched-mode power converter.

SUMMARY

To this end, one aspect of the invention relates to a method for detecting an electrical fault in an electrical installation, said electrical installation comprising a power source based on a switched-mode power converter, the method comprising steps of:
- measuring, with a sensor associated with an electrical protection device protecting the installation, an alternating electric current flowing through the electrical installation;
- detecting an electrical fault, such as a short-circuit, on the basis of the measured electric current, by means of an electronic control device;
- tripping the electrical protection device when an electrical fault is identified by the electronic control;

wherein detecting an electrical fault includes identifying a transition of the measured current from a first level to a second level, said transition having a duration lower than a predefined threshold, the predefined threshold being lower than or equal to 10% of the nominal period of the alternating electric current, the first level and the second level corresponding to current values of opposite sign but the amplitude of which, in terms of absolute value, is higher than a predefined current threshold, the predefined current threshold being equal to the product of the trip threshold of the protection device and a weighting coefficient.

According to advantageous but non-mandatory aspects, such a method may incorporate one or more of the following features, alone or in any technically permissible combination:
- the electrical fault is detected only if, in addition, said measured transition of the current is identified to repeat over one or more periods of the measured alternating current, over a duration higher than or equal to a predefined duration;
- the predefined duration is higher than or equal to three times the nominal period of the alternating electric current;
- the predefined threshold is lower than or equal to 10% of the nominal period of the electric current;
- the weighting coefficient is higher than 1;
- the weighting coefficient is comprised between 1 and 5;
- the measured electric current is a single-phase or polyphase current, such as a three-phase current, and an electrical fault is considered to have been detected if said transition of the measured current is identified for at least one electrical phase of the measured current.

According to another aspect, the invention relates to a protection system for protecting an electrical installation comprising a power source based on a switched-mode power converter, the protection system comprising at least one electrical protection device and an electronic control device that is programmed to:

measure, with a sensor associated with an electrical protection device, an alternating electric current flowing through the electrical installation;

detect an electrical fault, such as a short-circuit, on the basis of the measured electric current;

trip the electrical protection device when an electrical fault is identified;

wherein detecting an electrical fault includes identifying a transition of the measured current from a first level to a second level, said transition having a duration lower than a predefined threshold, the predefined threshold being lower than or equal to 10% of the nominal period of the alternating electric current, the first level and the second level corresponding to current values of opposite sign but the amplitude of which, in terms of absolute value, is higher than a predefined current threshold, the predefined current threshold being equal to the product of the trip threshold of the protection device and a weighting coefficient.

According to advantageous but non-mandatory aspects, such a system may incorporate one or more of the following features, alone or in any technically permissible combination:

one electronic control device is associated with each electrical protection device;

the electronic control device is connected to each electrical protection device.

BRIEF DESCRIPTION OF THE DRAWINGS

The invention will be better understood and other advantages thereof will become more clearly apparent in light of the following description of one embodiment of a method for detecting an electrical fault, which description is given merely by way of example and with reference to the appended drawings, in which.

DETAILED DESCRIPTION

Figure 1:
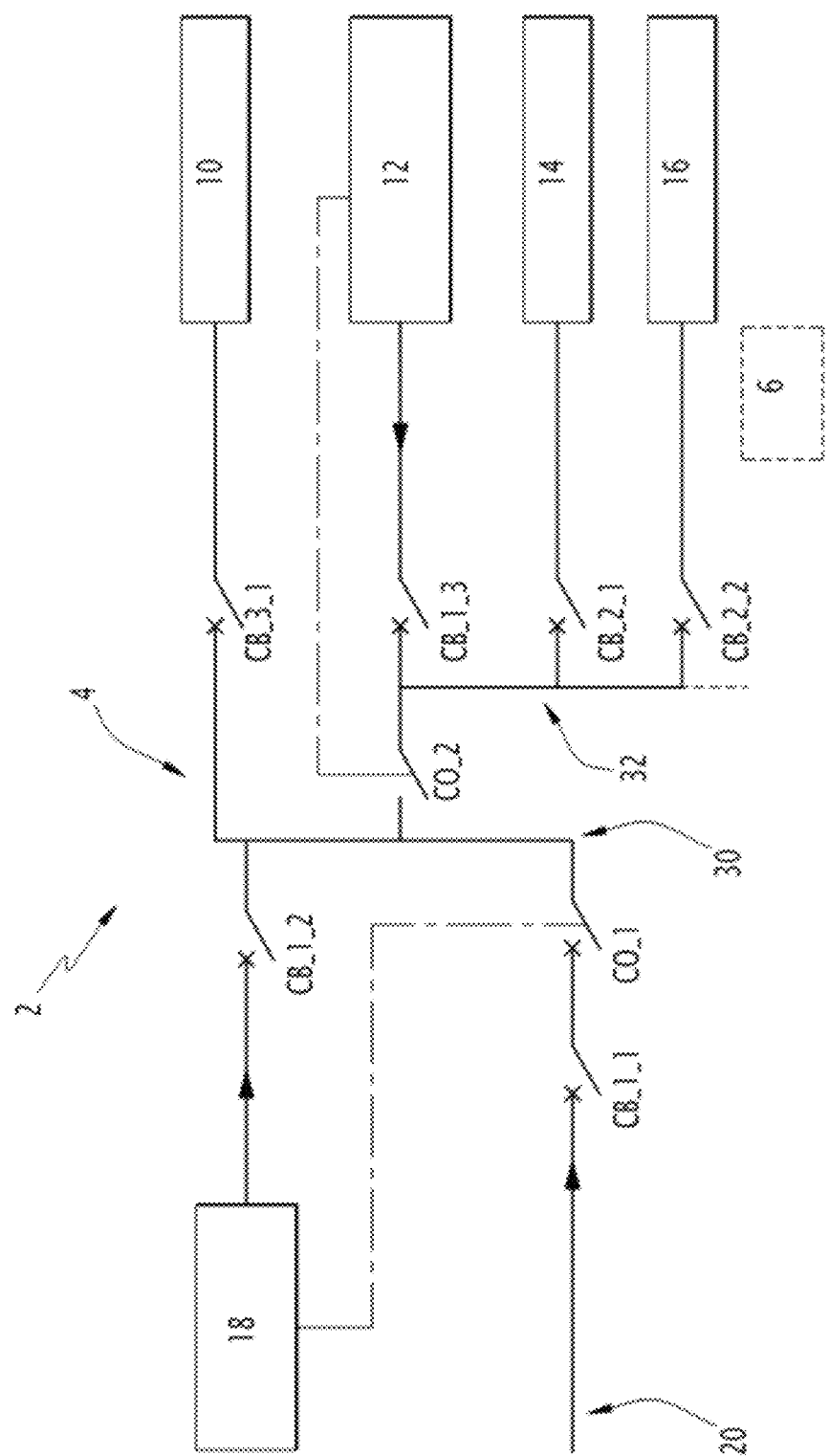
FIG. 1 is a schematic overview of one example of an electrical installation according to the invention.

FIG. 1 shows one example of an electrical installation 2, such as an installation for distributing electricity in a building or in a group of buildings.

The electrical installation 2 comprises at least one electrical load and a power source comprising a switched-mode power converter including one or more power switches, such as power semiconductor components. Below, this power source is said to be semiconductor-based. The installation also comprises at least one protection device and electrical conductors allowing the current produced by the one or more power sources to be distributed to the one or more electrical loads.

The electrical installation 2 is here configured to distribute an alternating current (AC).

For example, the electrical installation 2 is configured to distribute a polyphase current, such as a three-phase current, optionally comprising a neutral line.

Preferably, at least one of the power sources of the electrical installation 2 is a photovoltaic source comprising one or more solar panels connected to a switched-mode power converter, such as an inverter, the power converter comprising power semiconductor components, such as transistors.

The installation 2 also comprises a protection system 4 configured to protect the installation 2 against electrical faults and more particularly against short circuits.

The protection system 4 for example comprises one or more electrical switching devices, such as contactors, and one or more electrical protection devices, such as circuit breakers, and measurement devices capable, for example, of measuring electric current or voltage in the installation 2.

The measurement devices for example comprise sensors able to measure an alternating current, preferably for each electrical phase, and may be associated with various electrical protection devices.

The protection system 4 also comprises an electronic control device 6 capable of detecting an electrical fault, such as a short-circuit, and to control at least one protection device accordingly.

In certain variants, the electronic control device 6 is connected to one or more protection devices.

However, in preferred embodiments, the protection system 4 comprises a plurality of electronic control devices 6, each being integrated into one protection device in order to control that protection device.

In many examples, the electronic control device 6 comprises electronic circuits. For example, the electronic control device 6 comprises a processor, such as a programmable microcontroller or a microprocessor. The processor is coupled to a computer memory, or to a computer-readable data storage medium, that contains executable instructions and/or software code intended to implement a method for detecting an electrical fault such as will be described below, when these instructions are executed by the processor.

According to variants, the electronic control device 6 may include a digital signal processor (DSP), or a programmable logic controller (PLC), or a field-programmable gate array (FPGA), or an application-specific integrated circuit (ASIC), or any equivalent element.

In the example illustrated in FIG. 1, the installation 2 comprises a first electrical load 10, an electricity storage device 12, second electrical loads 14 and 16, a photovoltaic power source 18 and a point of connection to an electrical distribution grid 20.

The electricity storage device 12, which for example comprises at least one electrochemical battery (or any other type of energy storage), may operate alternately as an electrical load (when it is in the process of storing or holding energy) or as a power source (when it delivers energy to power the installation 2). The electricity storage device 12 may also be an electric vehicle connected to a charging station connected to the installation 2.

In certain installations, it is possible to distinguish between electrical loads that are said to be critical, and which as far as possible must not be interrupted, and ordinary electrical loads that are said to be non-critical, an interruption of the supply of power to which is tolerable to a certain extent.

For example, the first electrical load 10 is a non-critical load and the second electrical loads 14 and 16 are critical electrical loads, this example being non-limiting.

The electrical loads 14 and 16 are for example connected so as to be able to be easily supplied with power by the electricity storage device 12 when the sources 18 and 20 are unavailable.

The sources 18 and 20 are connected to a main distributor 30 itself connected to the electrical loads 10 to 16.

For example, the photovoltaic source 18 is connected to the distributor 30 by way of an electrical protection device, such as a circuit breaker, denoted CB_1_2. The electrical grid 20 is connected to the distributor 30 by way of an electrical protection device, such as a circuit breaker, denoted CB_1_1, and of a switching device CO_1, such as a contactor, which in this example may be controlled by the photovoltaic source 18, for example in order to disconnect the electrical grid 20 when the photovoltaic source 18 is delivering enough electricity to the installation 2.

The first electrical load 10 is connected to the distributor 30 by way of an electrical protection device, such as a circuit breaker, denoted CB_3_1.

The second electrical loads 14 and 16 are connected to a secondary distributor 32 by way of electrical protection devices, such as circuit breakers, denoted CB_1_3, CB_2_1 and CB_2_2, respectively.

The secondary distributor 32 is here connected to the distributor 30 by way of a switching device CO_2, such as a contactor, which may for example be controlled by the electricity storage device 12.

The installation 2 could as a variant be constructed differently, for example with different loads and/or with different power sources and/or possess a different number of protection or switching devices and/or have a different arrangement.

Figure 6:
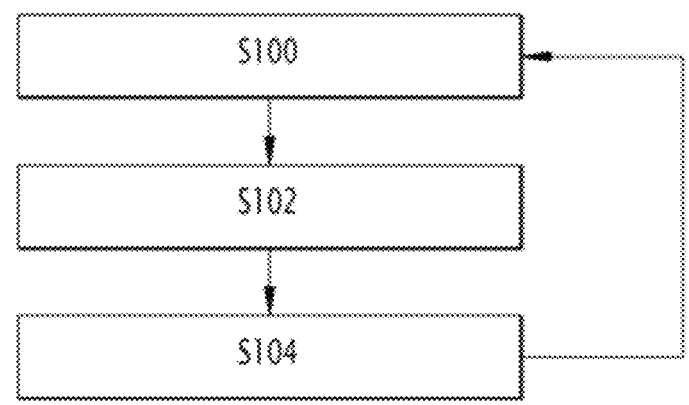
FIG. 6 is a flowchart showing one example of a method for detecting an electrical fault according to the invention.

Generally, as illustrated with reference to FIGS. 3, 4 and 6, the protection system 4 is more particularly configured to implement, for each protection device (such as a circuit breaker) associated with an electrical load and/or a power source of the installation 2, a method comprising steps of:

- measuring (step 100), with a sensor associated with an electrical protection device protecting the installation, an alternating electric current flowing through the electrical installation;
- detecting (step 102) an electrical fault, such as a short-circuit, on the basis of the measured electric current, by means of an electronic control device 6;
- tripping (step 104) the electrical protection device when an electrical fault is identified by the electronic control device 6.

According to aspects of the invention, detecting an electrical fault includes identifying a transition of the measured current from a first level to a second level, said transition having a duration ($\gamma\_t$) lower than a predefined threshold ($\delta\_t$), the predefined threshold for example being lower than or equal to 10% of the nominal period of the alternating electric current, the first level and the second level corresponding to current values of opposite sign but the amplitude of which, in terms of absolute value, is higher than a predefined current threshold, the predefined current threshold being equal to the product of the trip threshold (Ir_cb) of the protection device and a weighting coefficient ($\alpha\_Ir\_cb$).

For example, in step 102, each time the electronic control device 6 detects a transition from a first level to a second level, the electronic control device 6 measures the duration ($\gamma\_t$) of the transition and compares this duration with the predefined threshold ($\delta\_t$).

Preferably, the method is implemented when the source 18 is connected to the electrical installation and is supplying power to the electrical installation, by delivering an electric current to one or more electrical loads connected to the installation 2.

In certain examples, the grid 20 is not connected to the installation 2 when the method is implemented.

As a variant, the steps might be executed in a different order. Some steps might be omitted. The described example does not prevent, in other embodiments, other steps being implemented conjointly and/or sequentially with the described steps.

It will be understood that these steps, and especially steps 100 and 102, may be repeated, for example until a fault is identified.

For example, in step 100, the electric current is continuously measured by the sensors of the measurement devices, at one or more points in the installation (and preferably for each electrical protection device). The sensors may for example measure or sample the electric current periodically over time.

Advantageously, in the case where the measured electric current is a polyphase current, such as a three-phase current, an electrical fault is considered to have been detected in step 102 if said transition of the measured current is identified for at least one electrical phase of the measured current.

The same measurement and detection principle is applicable to any single-phase circuit.

Figure 3:
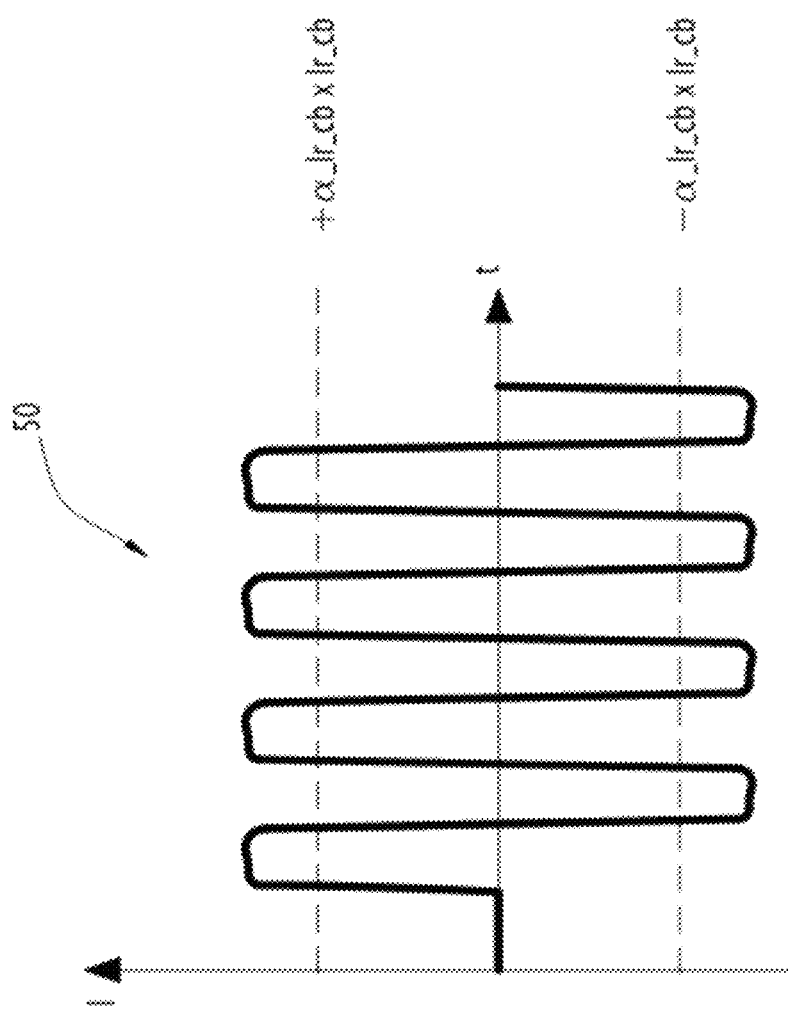
FIG. 3 shows the variation in an electric current over time in the presence of an electrical fault in an electrical installation, to illustrate a first signature of an electrical fault.

FIG. 3 illustrates in more detail one of the conditions that must be met for an electrical fault to be identified by the method. In this example, the curve 50 represents the variation in the measured current (denoted I, y-axis, arbitrary units) as a function of time (denoted t, x-axis, arbitrary units).

In this example, the measured current (solid line) exhibits periodic alternations between a high state and a low state, which take the form of plateaus and have opposite signs. These high and low states for example take a plateau form because the current is limited as a result of an action taken to protect the power source. However, as a variant, the measured current could take a different form. It could for example be a question of a maximum and of a minimum, respectively, in the case of a current signal of sinusoidal form.

The dashed lines define a first level ($+\alpha\_Ircb \times Ir\_cb$) and a second level ($-\alpha\_Ir\_cb \times Ir\_cb$).

The second level ($-\alpha\_Ir\_cb \times Ir\_cb$) corresponds, in terms of absolute value, to an equivalent amplitude to the first level ($+\alpha\_Ircb \times Ir\_cb$), but has an opposite sign (here a negative sign).

The first level and second level are therefore, in terms of absolute value, both equivalent to the predefined current threshold ($\alpha\_Ir\_cb \times Ir\_cb$).

The transition employed to detect a fault corresponds to a transition between a value higher than the first level and a value lower than the second level.

In other words, one condition that must be met before the transition is detected is that the current pass from a magnitude (amplitude) higher than the first level to an amplitude lower than the second level (or vice versa, from the second level to the first level).

In other words, a variation in current will not be considered to be such a transition if it occurs between values the amplitude of which is lower in absolute value than said predefined current threshold.

As explained above, the predefined current threshold is equal to the product of the trip threshold (Ir_cb) of the protection device and a weighting coefficient ($\alpha\_Ir\_cb$). The trip threshold (Ir_cb) of the protection device for example corresponds to a value to which the current (Ir) of the protection device is set (if it is settable in nature) or to its nominal current (if it cannot be set).

Advantageously, the weighting coefficient ($\alpha\_Ir\_cb$) is higher than 1.

For example, the weighting coefficient ($\alpha\_Ir\_cb$) is comprised between 1 and 5.

Other values are possible as variants.

Figure 4:
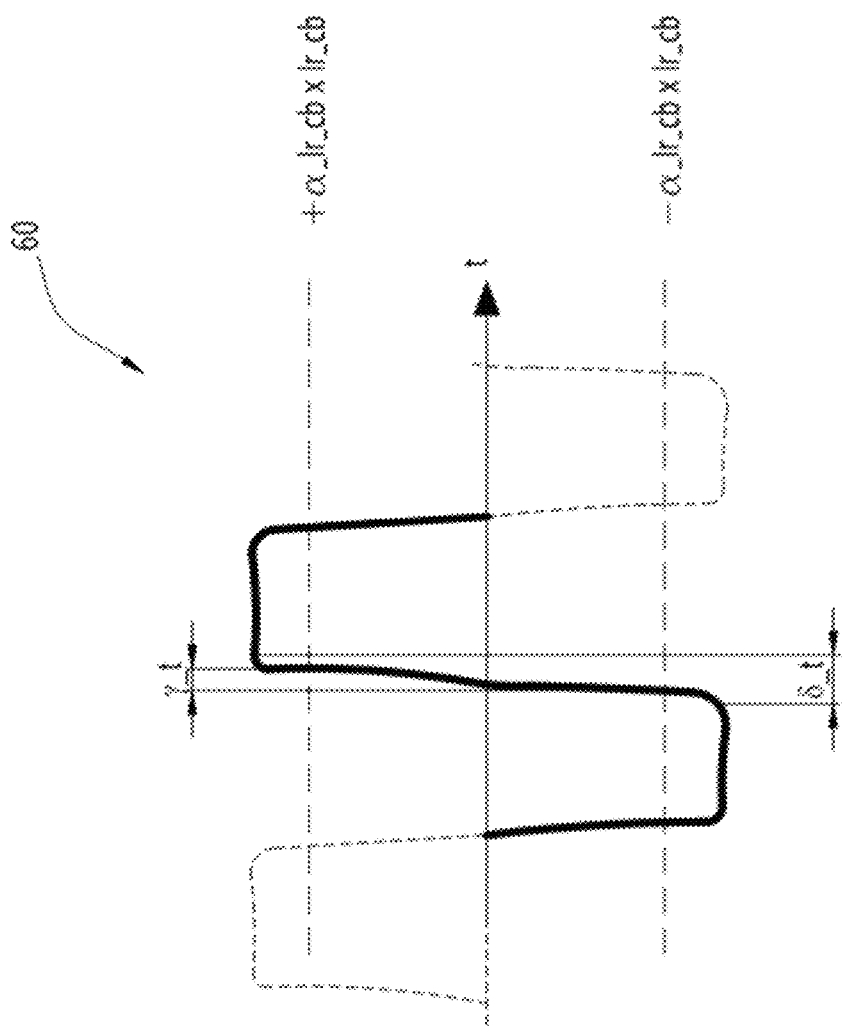
FIG. 4 shows the variation in an electric current over time in the presence of an electrical fault in an electrical installation, to illustrate a second signature of an electrical fault.

FIG. 4 illustrates in more detail another condition that must be met for an electrical fault to be identified by the method. In this example, the curve 60 represents the variation in the measured current (y-axis, arbitrary units) as a function of time (denoted t, x-axis, arbitrary units).

The dashed lines define, as above, the first level ($+\alpha\_Ircb \times Ir\_cb$) and the second level ($-\alpha\_Ir\_cb \times Ir\_cb$).

In this example, as above, the measured current exhibits periodic alternations between a high state and a low state having opposite signs (one being positive and one being negative, and here taking the form of plateaus), one transition being more rapid than the other transitions.

FIG. 4 illustrates the duration ($\gamma\_t$) of the transition and the predefined threshold ($\delta\_t$).

For example, the value of the predefined threshold ($\delta\_t$) depends on characteristics of the switched-mode power converter forming said power source, such as the nominal periodicity of the measured current (which depends on the switching frequency of the power converter) and on the maximum rate of variation in current permitted by the self-inductances or switching choke of the power converter (or any other element limiting the rate of variation in current).

Preferably, the predefined threshold ($\delta\_t$) is for example lower than or equal to 10% of the nominal period of the electric current.

According to one example, which is given by way of illustration, for a power converter operating with a switching frequency of 10 kHz, the predefined threshold ($\delta\_t$) may be equal to 2 milliseconds (ms).

In other words, a second condition that must be met for the transition to be detected is that said transition have a duration ($\gamma\_t$) lower than a predefined threshold ($\delta\_t$).

By virtue of the invention, it is possible to detect, easily and with a good level of reliability, electrical faults, such as short circuits, in an installation supplied with power by a power source based on a switched-mode power converter such as an inverter.

Rather than base detection only on detection of an abnormally high current, the protection system 4 identifies an electrical fault, especially a short-circuit, by identifying an abnormally rapid rate of transition between a high state and a low state having a certain amplitude.

It is therefore easier to detect a short-circuit when a power source comprising (or associated with) a switched-mode power converter is active in the electrical installation, without however having to decrease the trip thresholds of all the protection devices. Thus, the current thresholds useable by the electrical loads may be increased and thus the electrical installation 2 used more efficiently.

According to particularly advantageous embodiments, in step 102, the electrical fault is detected only if, in addition, said measured transition of the current is identified to repeat for one or more periods of the measured alternating current, over a duration higher than or equal to a predefined duration (Load_Tr).

Advantageously, the predefined duration (Load_Tr) is for example higher than or equal to three times the nominal period of the alternating electric current.

For example, the nominal period of the measured current is the period of the alternating current delivered by the power converter associated with said power source.

According to one example, which is given by way of illustration, the predefined duration (Load_Tr) is equal to 40 milliseconds (ms).

Figure 5:
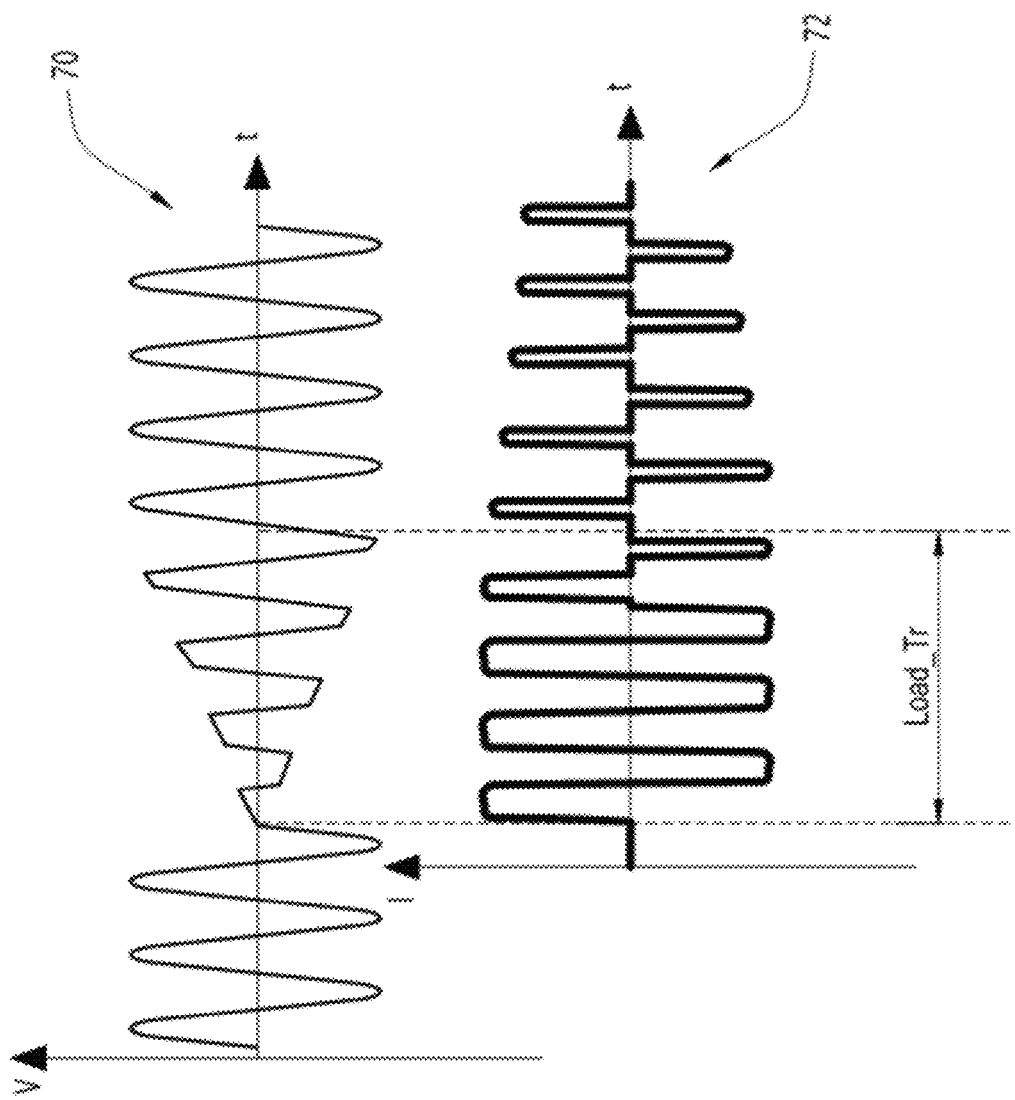
FIG. 5 shows the variation in a voltage and in an electric current over time comprising a non-linear transition on connection of an electrical load.

FIG. 5 illustrates an example of modification of the voltage and of the electric current in the installation caused by a non-linear transient effect.

Such a non-linear transient effect may be caused by the electrical load monitored by the protection devices, for example at the moment of connection of the load to the electrical installation.

In this figure, the curve 70 illustrates the variation in voltage (denoted V, y-axis, arbitrary units) as a function of time (denoted t, x-axis, arbitrary units).

The curve 72 illustrates the variation in the electric current (denoted I, y-axis, arbitrary units) as a function of time (denoted t, x-axis, arbitrary units).

In this example, from an initial time, the electric current undergoes rapid transitions between a first state and a second state of opposite sign. In parallel, the voltage, which up to this point varied periodically with a sinusoidal form, experiences a rapid voltage drop.

Subsequently, after a duration that in this example corresponds to three nominal periods of the current, the duration of the transitions increases whereas the maximum amplitude (in terms of absolute value) reached by the electric current in each alternation gradually decreases. In parallel, the voltage increases to return to a normal waveform, such as potentially the sinusoidal form that it originally had.

Such an effect does not correspond to a short-circuit, but rather to a transient effect related to the behaviour of a load (connection of an electrical load for example) and must therefore a priori not cause the protection device located just upstream to trip.

The predetermined duration Load_Tr allows a sufficient amount of time to be waited to ensure that the variation in the electric current is caused merely by a transient effect.

Taking this predetermined duration Load_Tr into account allows untimely tripping of the protection device as a result of a simple transient effect to be avoided. This makes the detection method more reliable.

Taking this predetermined duration Load_Tr into account also allows untimely tripping of the protection device in case of a current surge originating from the grid 20 to be avoided. In this case, the protection device will nonetheless be tripped, but by the conventional tripping device rather than via the present method. In other words, the method does not prevent conventional protection means from working.

Again preferably, while the method is waiting the predetermined duration Load_Tr, it is preferable for the first condition and the second condition to be met for each alternation during this time. This allows the detection method to be made more robust and less sensitive to transient effects.

Specifically, it is possible, in the case of a transient effect, for the condition on transition rate (criterion regarding the duration $\gamma\_t$) to be met for the first transition but not for the following transitions.

In other words, preferably, a third condition that must be met, for the transition to be detected, is that the first and second conditions be met for a plurality of transitions of the measured current, these transitions being repeated during a sufficiently long duration (the predetermined duration Load_Tr).

Figure 2:
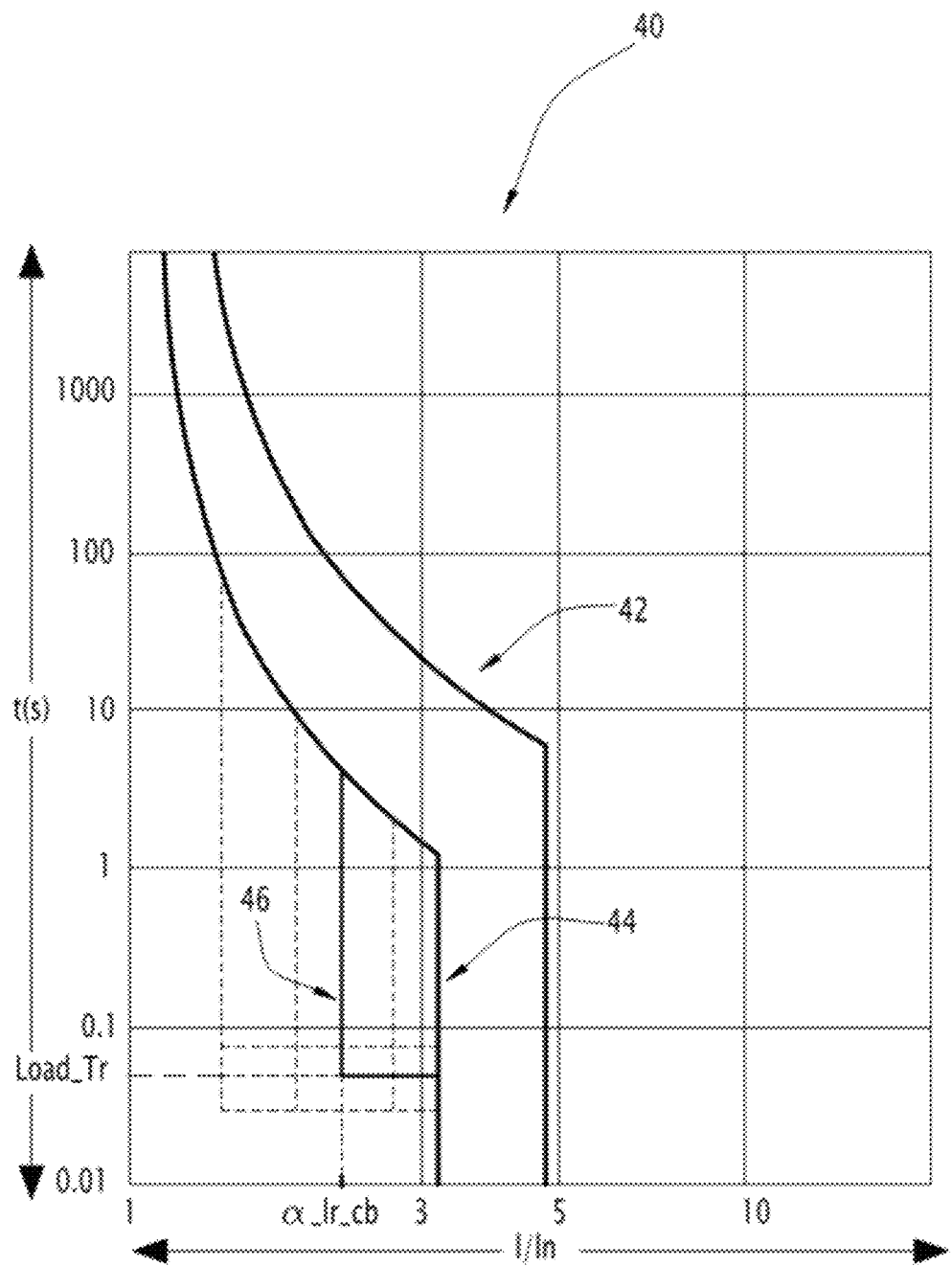
FIG. 2 is a plot of tripping curves of an electrical protection device in the electrical installation of FIG. 1.

FIG. 2 schematically shows an example 40 of two tripping curves associated with electrical protection devices, such as circuit breakers.

In these two curves, the x-axis corresponds to the time axis (denoted t(s)) expressed on a logarithmic scale, whereas the y-axis corresponds to the ratio of the current to the nominal current (In) of the protection device.

The tripping curves 42 and 44 correspond to conventional maximum and minimum tripping curves. The first portion of these tripping curves (here for times longer than a few seconds) corresponds to "long" faults such as current surges, whereas the second portion of the curve (here for times shorter than a few seconds) corresponds to "short" faults such as short-circuits.

Tripping curve 46 corresponds to an improved curve for a protection device, for protecting the installation 2, in which the method described above is implemented. In the illustrated example, tripping curve 46 is partially identical to the conventional minimum tripping curve 44. Tripping curve 46 comprises an additional tripping-curve segment (drawn here with a thin line) that illustrates the effect of the detection method described above and that is here different from the conventional minimum tripping curve 44.

In particular, rapid electrical faults (such as short-circuits) may be detected more easily, as a triggering threshold ($\alpha\_Ir\_cb \times Ir\_cb$) that is more sensitive than the current threshold (Ir_cb) employed in protection devices is used.

When the conditions of short-circuit detection according to the method are not met (the first condition and second condition described above, or even the third condition), then conventional triggering conditions (as represented by the conventional triggering curves 42 and 44) apply.

The embodiments and the variants envisaged above can be combined with one another so as to create new embodiments.

The invention claimed is:

1. A method for protecting an electrical installation, said electrical installation comprising a power source based on a switched-mode power converter, the method comprising:
    measuring, with a sensor associated with an electrical protection device protecting the installation, an alternating electric current flowing through the electrical installation;
    detecting an electrical fault on the basis of the measured alternating electric current, by means of an electronic control device; and
    controlling tripping of the electrical protection device when the electrical fault is detected by the electronic control device;
    wherein detecting the electrical fault includes identifying a transition of the measured alternating electric current from a first level to a second level, said transition having a duration lower than a predefined threshold, the predefined threshold being lower than or equal to 10% of a nominal period of the alternating electric current, the first level and the second level corresponding to current values of opposite sign but an amplitude of which, in terms of absolute value, is higher than a predefined current threshold, the predefined current threshold being equal to a product of a trip threshold of the electrical protection device and a weighting coefficient, and the electrical fault is detected if the transition of the measured current is identified.

2. The method according to claim 1, wherein the electrical fault is detected only if, in addition, said transition of the measured current is identified to repeat over one or more periods of the measured alternating electric current, over a duration higher than or equal to a predefined duration.

3. The method according to claim 1, wherein the predefined duration is higher than or equal to three times the nominal period of the alternating electric current.

4. The method according to claim 1, wherein the predefined threshold is lower than or equal to 10% of the nominal period of the alternating electric current.

5. The method according to claim 1, wherein the weighting coefficient is higher than 1.

6. The method according to claim 5, wherein the weighting coefficient is comprised between 1 and 5.

7. The method according to claim 1, wherein the alternating electric current is a single-phase or polyphase current, and wherein the electrical fault is considered to have been detected if said transition of the measured alternating electronic current is identified for at least one electrical phase of the measured current.

8. A protection system for protecting an electrical installation comprising a power source based on a switched-mode power converter, the protection system comprising at least one electrical protection device and an electronic control device that is programmed to:
    measure, with a sensor associated with an electrical protection device of a plurality of electrical protection devices, an alternating electric current flowing through the electrical installation;
    detect an electrical fault on the basis of the measured alternating electric current; and
    control tripping of the electrical protection device when the electrical fault is detected;
    wherein detecting the electrical fault includes identifying a transition of the measured alternating electric current from a first level to a second level, said transition having a duration lower than a predefined threshold, the predefined threshold being lower than or equal to 10% of a nominal period of the alternating electric current, the first level and the second level corresponding to current values of opposite sign but an amplitude of which, in terms of absolute value, is higher than a predefined current threshold, the predefined current threshold being equal to a product of a trip threshold of the electrical protection device and a weighting coefficient, and the electrical fault is detected if the transition of the measured current is identified.

9. The protection system according to claim 8, wherein one electronic control device is associated with each electrical protection device of the plurality of protection devices.

10. The protection system according to claim 8, wherein the electronic control device is integrated into the electrical protection device or is connected to each electrical protection device of the plurality of protection devices.

* * * * *